(12) United States Patent
Shichi et al.

(10) Patent No.: US 9,640,360 B2
(45) Date of Patent: May 2, 2017

(54) ION SOURCE AND ION BEAM DEVICE USING SAME

(71) Applicant: Hitachi High-Technologies Corporation, Minato-ku, Tokyo (JP)

(72) Inventors: Hiroyasu Shichi, Tokyo (JP); Shinichi Matsubara, Tokyo (JP); Yoichi Ose, Tokyo (JP); Yoshimi Kawanami, Tokyo (JP); Noriaki Arai, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/351,559

(22) PCT Filed: Oct. 10, 2012

(86) PCT No.: PCT/JP2012/076161
§ 371 (c)(1),
(2) Date: Apr. 12, 2014

(87) PCT Pub. No.: WO2013/054799
PCT Pub. Date: Apr. 18, 2013

(65) Prior Publication Data
US 2014/0299768 A1    Oct. 9, 2014

(30) Foreign Application Priority Data
Oct. 12, 2011   (JP) .................................. 2011-224473

(51) Int. Cl.
*H01J 27/02*   (2006.01)
*H01J 37/08*   (2006.01)
(Continued)

(52) U.S. Cl.
CPC ............. *H01J 27/022* (2013.01); *H01J 37/08* (2013.01); *H01J 37/26* (2013.01); *H01J 37/28* (2013.01);
(Continued)

(58) Field of Classification Search
CPC ............. H01J 27/022; H01J 2237/0807; H01J 2237/0216; H01J 1/18; H01J 37/08; H01J 37/26; H01J 37/28
(Continued)

(56) References Cited

U.S. PATENT DOCUMENTS 4,143,292 A * 3/1979 Hosoki .................. H01J 1/304
                                                        252/502
5,831,379 A * 11/1998 Jeong ....................... H01J 1/16
                                                        313/346 DC
(Continued)

FOREIGN PATENT DOCUMENTS

JP     52-120673 A    10/1977
JP     58-085242 A    5/1983
(Continued)

OTHER PUBLICATIONS

Kuo, H.-S., et al., "Preparation and Characterization of Single Atom Tips", Nano Letters, vol. 4, No. 12, 2004, pp. 2379-2382.
(Continued)

*Primary Examiner* — Wyatt Stoffa
(74) *Attorney, Agent, or Firm* — Miles & Stockbridge P.C.

(57) ABSTRACT

Provided is a charged particle beam microscope which has a small mechanical vibration amplitude of a distal end of an emitter tip, is capable of obtaining an ultra-high resolution sample observation image and removing shaking or the like of the sample observation image. A gas field ion source includes: an emitter tip configured to generate ions; an emitter-base mount configured to support the emitter tip; a mechanism configured to heat the emitter tip; an extraction electrode installed to face the emitter tip; and a mechanism configured to supply a gas to the vicinity of the emitter tip, wherein the emitter tip heating mechanism is a mechanism of heating the emitter tip by electrically conducting a
(Continued)

filament connecting at least two terminals, the terminals are connected by a V-shaped filament, an angle of the V shape is an obtuse angle, and the emitter tip is connected to a substantial center of the filament.

11 Claims, 10 Drawing Sheets

(51) Int. Cl.
*H01J 37/28* (2006.01)
*H01J 37/26* (2006.01)
(52) U.S. Cl.
CPC ............... *H01J 2237/0216* (2013.01); *H01J 2237/0807* (2013.01)
(58) Field of Classification Search
USPC .......................................... 250/310; 313/341
See application file for complete search history.

(56) References Cited

U.S. PATENT DOCUMENTS

| | | | |
|---|---|---|---|
| 2004/0244879 A1 | 12/2004 | Tanaka et al. | |
| 2006/0226753 A1* | 10/2006 | Adamec | H01J 1/135 313/310 |
| 2008/0171663 A1* | 7/2008 | Tamura | 505/842 |
| 2009/0001266 A1* | 1/2009 | Frosien | H01J 37/08 250/307 |
| 2009/0114840 A1* | 5/2009 | Ward | H01J 27/26 250/423 F |
| 2009/0129550 A1* | 5/2009 | Bandy et al. | 378/141 |
| 2009/0152462 A1 | 6/2009 | Ishitani et al. | |
| 2009/0173888 A1* | 7/2009 | Shichi | H01J 27/26 250/397 |
| 2010/0019649 A1* | 1/2010 | Terui | B82Y 10/00 313/446 |
| 2010/0090581 A1* | 4/2010 | Terui | H01J 1/20 313/336 |
| 2010/0194262 A1* | 8/2010 | Nonogaki | H01J 1/15 313/343 |
| 2010/0237762 A1* | 9/2010 | Nonogaki | B82Y 10/00 313/310 |
| 2010/0301736 A1* | 12/2010 | Morishita | H01J 37/06 313/341 |
| 2011/0266465 A1 | 11/2011 | Shichi et al. | |
| 2012/0217391 A1 | 8/2012 | Shichi et al. | |
| 2013/0119252 A1 | 5/2013 | Kawanami et al. | |
| 2013/0126731 A1 | 5/2013 | Shichi et al. | |

FOREIGN PATENT DOCUMENTS

| | | |
|---|---|---|
| JP | 63-158730 A | 7/1988 |
| JP | 05-198224 A | 8/1993 |
| JP | 05-205680 A | 8/1993 |
| JP | 06-243776 A | 9/1994 |
| JP | 2006-269431 A | 10/2006 |
| JP | 2008-091307 A | 4/2008 |
| JP | 2008-175640 A | 7/2008 |
| JP | 2009-517846 A | 4/2009 |
| JP | 2009-163981 A | 7/2009 |
| JP | 2009-164110 A | 7/2009 |
| JP | 2009-289670 A | 12/2009 |
| JP | 2013-118188 A | 6/2013 |
| WO | WO 03/031668 A1 | 4/2003 |
| WO | WO 2007/067328 A2 | 6/2007 |
| WO | WO 2008/140080 A1 | 11/2008 |
| WO | WO 2011/055521 A1 | 5/2011 |
| WO | WO 2011/096227 A1 | 8/2011 |
| WO | WO 2012/017789 A1 | 2/2012 |

OTHER PUBLICATIONS

Morgan, J., et al., "An Introduction to the Helium Ion Microscope", Microscopy Today, vol. 14, No. 4, Jul. 2006, pp. 24-31.

* cited by examiner (A)

(B)

(C)

(A)

(B)

(C)

(A)

(B) (C) (D)

(A)　　　　　　　　　(B)

ION SOURCE AND ION BEAM DEVICE USING SAME

TECHNICAL FIELD

The present invention relates to a charged particle microscope and an ion microscope, and more particularly, to a gas field ion source and an ion beam device.

BACKGROUND ART

The surface structure of a sample can be observed by scanning and irradiating the sample with an electron beam and detecting secondary charged particles emitted from the sample. This is called a "scanning electron microscope" (hereinafter referred to as a SEM). On the other hand, the surface structure of a sample can also be observed by scanning and irradiating the sample with an ion beam and detecting secondary charged particles emitted from the sample. This is called a "scanning ion microscope" (hereinafter, referred to a SIM). Particularly, the irradiation of the sample with ion species with light mass such as hydrogen, helium, or the like makes a sputtering function become relatively small, so that the irradiation is suitable for sample observation.

The ion beam has a characteristic of being sensitive to information on the surface of the sample in comparison to the electron beam. This is because the excited area of secondary charged particles is localized according to the surface of the sample in comparison to the irradiation with the electron beam. In addition, with respect to the electron beam, since the properties of electrons as a wave cannot be neglected, aberration occurs due to the diffraction effect. On the other hand, with respect to the ion beam, since the ion is heavier than the electron, the aberration due to the diffraction effect is very small in comparison with the electron beam.

If the electron beam is irradiated on the sample and the electrons that have transmitted through the sample are detected, information on the internal structure of the sample can be obtained. Similarly, if the ion beam is irradiated on the sample and the ions that have transmitted through the sample are detected, information on the internal structure of the sample can also be obtained. This is called a transmission ion microscope. Particularly, the irradiation of the sample with ion species with light mass such as hydrogen, helium, or the like makes a ratio of transmission through the sample become large, so that the irradiation is suitable for sample observation.

On the contrary, the irradiation of the sample with ion species with heavy mass such as oxygen, nitrogen, argon, krypton, xenon, gallium, indium, or the like is suitable for sample processing due to the sputtering function. Particularly, a focused ion beam apparatus (hereinafter, referred to as an FIB) using a liquid metal ion source (hereinafter, referred to as an LMIS) is known as an ion beam processing apparatus. In addition, a plasma ion source or a gas field ion source may generate gas ions of oxygen, nitrogen, argon, krypton, xenon, or the like and the gas ions are irradiated on the sample, so that the sample processing can be performed.

In an ion microscope mainly for the sample observation, the gas field ion source is very suitable as an ion source. In the gas field ion source, gas such as hydrogen or helium is supplied to a metal emitter tip having a curvature radius of about 100 nm at the distal end, and a high voltage of several kilo voltages or more is applied to the emitter tip, so that the gas molecules are field-ionized, and the ionized molecules are extracted as an ion beam. The ion source has a characteristic that, since an ion beam having a narrow energy width can be generated and a size of the ion source is small, a minute ion beam can be generated.

In the ion microscope, in order to observe the sample at a high signal-to-noise ratio, an ion beam having a high current density needs to be obtained on the sample. For this reason, an ion radiation angular current density of the gas field ion source needs to be high. In order to increase the ion radiation angular current density, the emitter tip may be cooled down to a very low temperature. PTL 1 discloses that a minute protrusion is formed at a distal end of an emitter tip so as to improve characteristics of an ion source. NPL 1 discloses that a minute protrusion at a distal end of an emitter tip is made of a second metal different from a material of the emitter tip. NPL 2 discloses a scanning ion microscope equipped with a gas field ion source emitting helium ions.

PTL 2 discloses a structure which is configured to include an emitter for a charged particle beam is provided to first and second supporting portions, a filament extending therebetween, an emitter distal end portion provided to the filament, and a stabilization element provided for a third supporting portion and the filament, wherein the first, second, third supporting portions defines a triangle, so that the stabilization element at least partly extends in a direction perpendicular to the extension direction of the filament. According to the structure, a vibration amplitude of the emitter distal end portion is suppressed, so that resolution of a charged particle beam apparatus employing the emitter can be improved.

PTL 3 disclose an electronic source including a needle-shaped tip having an electron emission portion at one end, a cup-shaped part jointed to the other end of the needle-shaped tip different from the one end thereof, and a filament for heating the cup-shaped part, wherein the filament is disposed in an air gap defined inside the cup-shaped part so as not to be connected to the cup-shaped part. Although external vibration is applied to an apparatus using the electronic source, the apparatus can emit a stabilized electron beam.

PTL 4 discloses a structure of an electronic source where a pair of conductive terminals are provided for an insulator, a tip having an electron radiation portion is bonded to a filament attached between the conductive terminals, and the other end of the tip different from the electron radiation portion is fixed to the insulator, a structure of an electronic source where the other end of the tip different from the electron radiation unit is fixed to the insulator through a metal pin soldered to the insulator; and a structure of an electronic source where a curved portion is provided to the filament. Although external vibration is applied to an apparatus using the electronic source, the apparatus can emit a stabilized electron beam.

PTL 5 discloses a structure of a gas field ion source where a filament is supported by a plurality of pillars, for example 3, 4, 5, or 6 pillars. Sensitivity of an emitter to mechanical vibration can be reduced.

In addition, PTL 6 discloses a thermal field emission electron gun which is characterized in that, in a thermal field emission cathode capable of radiating a stabilized electron beam effective to the purpose of a high speed electron beam exposure apparatus or the like, a filament for heating a needle-shaped electrode has a structure of a V shape, and an angle of the V shape is in a range of 30 degrees to 90 degrees.

CITATION LIST

Patent Literature

PTL 1: JP 58-85242 A
PTL 2: JP 2006-269431 A
PTL 3: WO 2008-140080 A
PTL 4: JP 2008-91307 A
PTL 5: JP 2009-517846 W
PTL 6: JP 06-243776 A

Non-Patent Literature

NPL 1: H.-S. Kuo, I.-S. Hwang, T.-Y. Fu, J.-Y. Wu, C.-C. Chang, and T. T. Tsong, Nano Letters 4 (2004) 2379.
NPL 2: J. Morgan, J. Notte, R. Hill, and B. Ward, Microscopy Today, Jul. 14, 2006 24

SUMMARY OF INVENTION

Technical Problem

The gas field ion source where a distal end of the metal emitter tip has a structure of a nano-pyramid has the following problems. The characteristic of the ion source is to use ions emitted from the vicinity of one atom at the distal end of the nano-pyramid. Namely, the area of ion emission is narrow, and the size of the ion beam is as small as nanometers or less. Therefore, the current per unit area and unit solid angle, that is, brightness is high. If the ion beam is condensed on the sample with the same magnification, or if the ion beam is condensed on the sample with the contraction ratio of several fractions, the beam diameter of, for example, about 0.1 nm to 1 nm can be obtained. Namely, observation with ultra-high resolution of about 0.1 nm to 1 nm can be implemented. Herein, it is possible to obtain a characteristic in that the diameter of the ion beam on the projected image is increased as the magnification is increased; and however, the obtained current is also increased. If the current is increased, there is an advantage in that the signal-to-noise ratio of the image can be increased, and the image acquisition time can be shortened. Namely, it is possible to obtain a characteristic in that, although the magnification is large, since the diameter of the ion beam is as small as nanometers or less, the diameter of the ion beam on the projected image can also be limited to be less than 1 nm, and the current is large. This is also different from the situation of an ultra-high resolution scanning electron microscope including a field emission type electron gun. Although the diameter of the beam of the field emission type electron gun is as small as the order of nanometers, since the diameter is larger than that of a gas field ion source, the magnification is set to be ¹⁄₁₀ or less in order to obtain a sub-nanometer resolution.

If the distal end of the emitter tip is mechanically vibrated, the ion beam on the sample is also vibrated. This causes deterioration in resolution or shaking in an image of the sample observation. Particularly, as described above, this influence is great in the case of use under the condition that the magnification is large. For example, in the case where the magnification is 1, when the vibration amplitude of the distal end of the emitter tip is 1 nm, the ion beam on the sample is vibrated by 1 nm. This means that great deterioration in resolution or shaking of an image occurs in a sub-nanometer resolution image. Therefore, in comparison with a scanning electron microscope in the related art, in the ion microscope, reducing the mechanical vibration amplitude of the distal end of the emitter tip is one of the most important problems.

An object of the present invention is to provide an ion microscope and a charged particle beam apparatus capable of implementing a small mechanical vibration amplitude of a distal end of the emitter tip and ultra-high resolution observation without shaking or the like in a sample observation image.

Solution to Problem

The present invention is a gas field ion source including: an emitter tip configured to generate ions; an emitter-base mount configured to support the emitter tip; a mechanism configured to heat the emitter tip; an extraction electrode installed to face the emitter tip and configured to include an opening allowing the ions to pass therethrough; and a mechanism configured to supply a gas to the vicinity of the emitter tip, wherein the emitter tip heating mechanism is a mechanism of heating the emitter tip by electrically conducting a filament connecting at least two protrusion terminals, the terminals are connected by a V-shaped filament, an angle of the V shape is an obtuse angle, and the emitter tip is connected to a substantial center of the filament.

In addition, connection points between the terminals and the filament is connected by the filament at an approximately shortest distance, and the emitter tip is connected to a substantial center of the filament.

In addition, the filament has a shape of a straight line.

In addition, in the gas field ion source, a second wire material connecting at least two terminals besides the filament exists, and the emitter tip is connected to the filament and the second wire material.

In addition, the emitter tip heating mechanism is a mechanism of heating the emitter tip by electrically conducting a filament connecting at least two terminals, the emitter tip is connected to a substantial center of the filament, in the case where a temperature of the emitter tip is relatively low, the emitter tip is connected to the terminals excluding the two terminals, and in the case where the temperature of the emitter tip is relatively high, the emitter is not connected.

In addition, in the gas field ion source, a substantial central portion of the extraction electrode has a convex structure.

In addition, in the gas field ion source, the cross section of the filament has a U shape, a V shape, or a hollow tube shape.

In addition, in the gas field ion source, the filament is made of manganin.

In addition, in the gas field ion source, the filament is subjected to ceramic coating.

In addition, in the gas field ion source, the filament has a structure where localized resistivity of the substantial central portion of the filament is relatively high.

In addition, in the gas field ion source, the structure where the localized resistivity is relatively high has a locally V shape or a locally U shape.

In addition, the gas supplied to the gas field ion source contains at least one of hydrogen, helium, neon, argon, krypton, and xenon.

In addition, the emitter tip of the gas field ion source is configured in a shape of a nano-pyramid.

In addition, in a charged particle beam apparatus equipped with the gas field ion source, a magnification of projection of an ion beam on a sample is at least 0.5 or more.

In addition, there is provided an ion beam device which is equipped with a gas field ion source and scans and irradiates a sample with an ion beam emitted from the gas field ion source and detects secondary particles emitted from the sample to obtain a sample observation image, wherein image shaking does not occur in the sample observation image with a resolution higher than the maximum resolution of a field ionization emission type scanning electron microscope.

Advantageous Effects of Invention

According to the present invention, in a charged particle beam microscope, it is possible to allow a mechanical vibration amplitude of a distal end of an emitter tip to be small, to obtain an ultra-high resolution sample observation image, and to remove shaking or the like in a sample observation image.

DESCRIPTION OF EMBODIMENTS

First Embodiment

Figure 1:
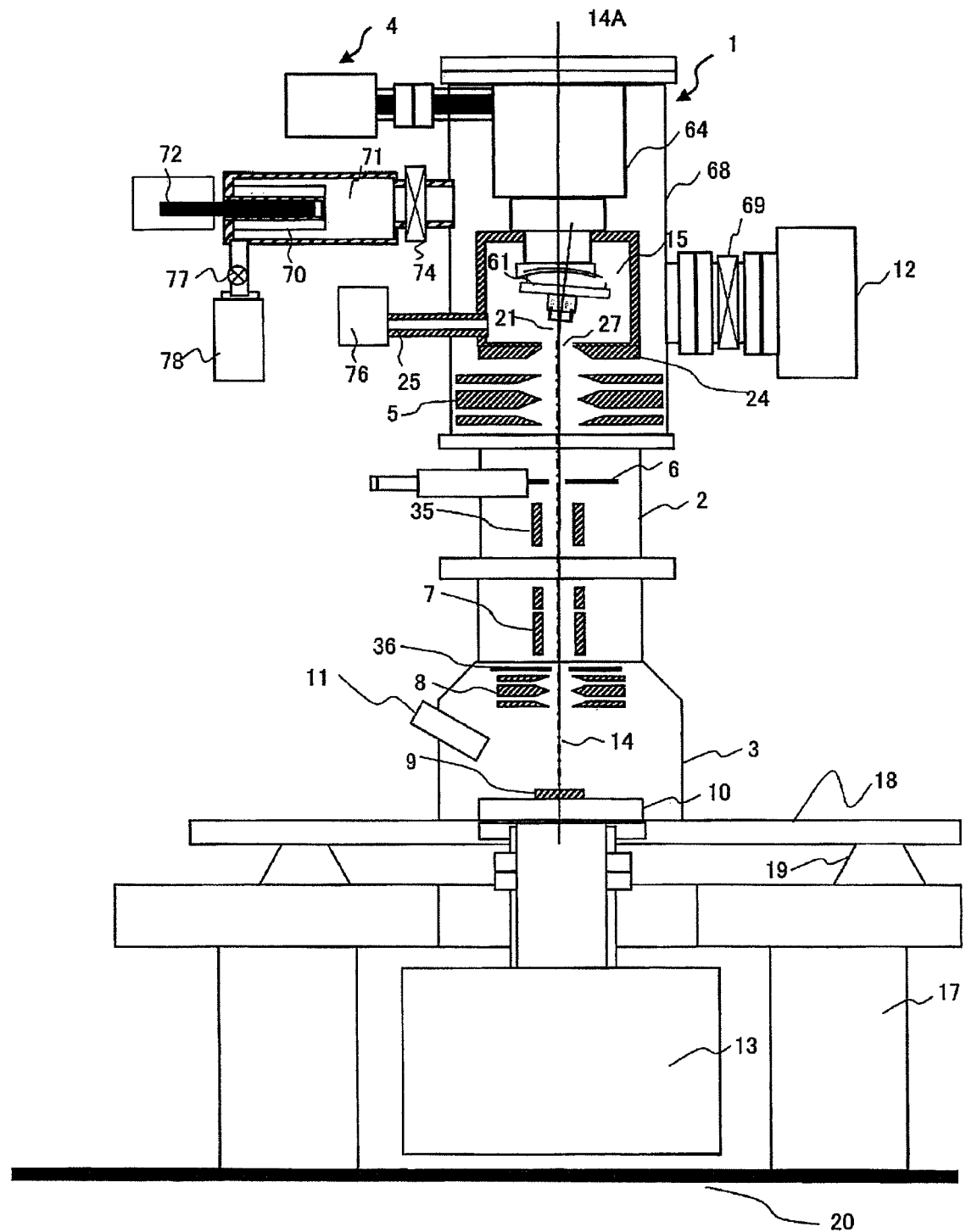
FIG. 1 is a schematic diagram illustrating a configuration of an example of a charged particle microscope according to the present invention.

An example of a charged particle microscope according to the present invention will be described with reference to FIG. 1. Hereinafter, a first embodiment of a scanning ion microscope apparatus as an ion beam apparatus will be described. The scanning ion microscope according to the embodiment is configured to include a gas field ion source 1, an ion beam irradiation system column 2, a sample chamber 3, and a cooling mechanism 4. Herein, the gas field ion source 1, the ion beam irradiation system column 2, and the sample chamber 3 are a vacuum chamber.

Although the configuration of the gas field ion source 1 will be described later in detail, a needle-shaped emitter tip 21 and an extraction electrode 24 provided to face the emitter tip and to include an opening 27 through which ions pass are included within a vacuum chamber 68. An ionization chamber 15 is provided to increase a pressure of ionized gases in the vicinity of the emitter tip. A gas supply pipe 25 provided at the front end of a gas supply mechanism 76 is connected to the ionization chamber 15 to supply the ionized gases to the vicinity of the emitter tip.

In addition, an ion source vacuum exhaust pump 12 is provided to vacuum-exhaust the vacuum chamber 68 of the gas field ion source 1. A vacuum cutoff valve 69 is disposed between the vacuum chamber 68 and the ion source vacuum exhaust pump 12.

In addition, a vacuum pump 71 containing non-evaporable getters 70 is connected to the vacuum chamber 68 of the gas field ion source 1. In addition, a heating mechanism 72 outside the vacuum chamber is provided to the non-evaporable getters 70. The heating mechanism is based on the principle of resistive heating, lamp heating, or the like.

A vacuum cutoff valve 74 is disposed between the vacuum pump 71 containing the non-evaporable getters 70 and the vacuum chamber 68. In addition, a vacuum pump 78 is connected to the vacuum pump 71 containing the non-evaporable getters 70 through a vacuum cutoff valve 77.

Furthermore, the gas field ion source 1 includes a tilting mechanism 61 which changes a tilt of the emitter tip 21, and the tilting mechanism 61 is fixed to an emitter-base mount 64. The tilting mechanism 61 is used for accurately adjusting the direction of the distal end of the emitter tip to an ion beam irradiation axis 14A. Due to the adjustment of the angle of the axis, it is possible to obtain an effect of reducing distortion of the ion beam.

In addition, the ion beam irradiation system is configured to include a condenser lens 5 which condenses ions emitted from the gas field ion source 1, a first aperture 6 which is movable and limits an ion beam 14 passing through the condenser lens 5, a first deflector 35 which scans or aligns the ion beam 14 passing through the first aperture 6, a second deflector 7 which deflects the ion beam 14 passing through the first aperture 6, a second aperture 36 which limits the ion beam 14 passing through the first aperture 6, and an objective lens 8 which condenses the ion beam passing through the first aperture on the sample.

In addition, although not illustrated, in some cases, a mass separator may be provided to the ion beam irradiation system. In addition, in some cases, a mechanism capable of tilting the condenser lens with respect to the ion beam irradiation axis 14A may be provided. The tilting mechanism 61 may be implemented as a relatively compact mechanism by using piezoelectric elements.

Herein, the first deflector 35 is a deflector which scans the ion beam in order to obtain an ion radiation pattern from the emitter tip. In addition, the "first" denotes that the deflector is located at the first position in the direction from the ion source 1 to the sample 9. However, a charged particle beam apparatus may be configured such that a deflector which is shorter than the length of the first defector 35 in the optical axis direction is provided between the first deflector 35 and the condenser lens 5, and the deflector is used to adjust the deflection axis of the ion beam 14.

In addition, a sample stage 10 which the sample 9 is mounted on and a secondary particle detector 11 are installed within the sample chamber 3. The ion beam 14 from the gas field ion source 1 is irradiated on the sample 9 through the ion beam irradiation system. The secondary particles from the sample 9 are detected by the secondary particle detector 11. Herein, the signal amount measured by the secondary particle detector 11 is almost proportional to the ion beam current passing through the second aperture 36.

The ion microscope according to the embodiment is configured to further include a sample chamber vacuum exhaust pump 13 which vacuum-exhausts the sample chamber 3. In addition, although not illustrated, an electron gun for neutralizing charge-up of the sample occurring at the irradiation of ion beam or a gas gun for supplying etching or deposition gas to the vicinity of the sample is provided to the sample chamber 3.

In addition, a base plate 18 is disposed through an anti-vibration mechanism 19 on the equipment stand 17 disposed on the floor 20. The field ion source 1, the column 2, and the sample chamber 3 are supported by the base plate 18.

The cooling mechanism 4 cools the interior of the field ion source 1, the emitter tip 21, the extraction electrode 24, and the like. In the embodiment, the cooling path is disposed in the inner portion of the emitter-base mount 64. In addition, in the case where the cooling mechanism 4 is configured by using, for example, Gifford-McMahon type (GM type) refrigerator, a compressor unit (compressor) which uses a helium gas as an operating gas (not illustrated) is installed on the floor 20. The vibration of the compressor unit (compressor) is transmitted through the floor 20 to the equipment stand 17. An anti-vibration mechanism 19 is disposed between the equipment stand 17 and the base plate 18 and has a characteristic of allowing high-frequency vibration of the floor not to be easily transmitted to the field ion source 1, the ion beam irradiation system column 2, the sample chamber 3, and the like. In the embodiment, as a source of vibration of the floor 20, the refrigerator 40 and the compressor 16 are exemplified. However, the source of vibration of the floor 20 is not limited thereto.

The anti-vibration mechanism 19 may be configured by using an anti-vibration rubber, a spring, a damper, or a combination thereof.

Figure 2:
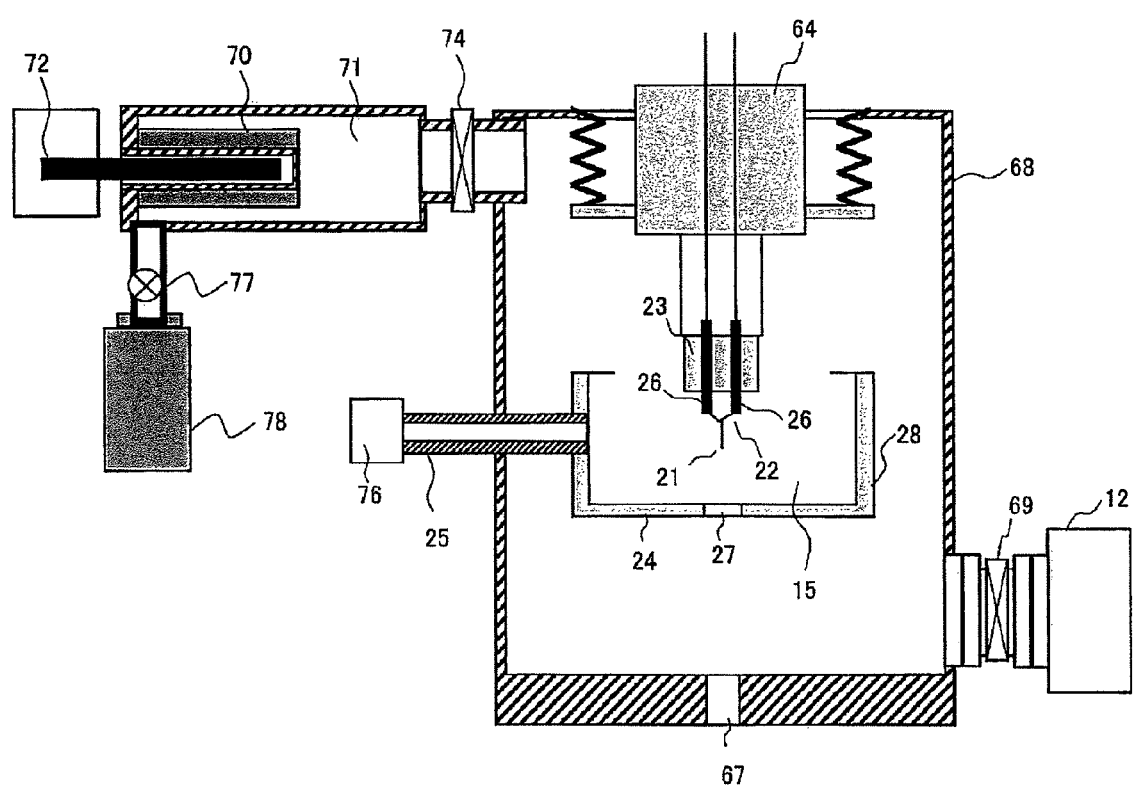
FIG. 2 is a diagram illustrating an example of a peripheral structure of an emitter tip of a gas field ion source of the charged particle microscope according to the present invention.

An example of the gas field ion source 1 of the charged particle microscope according to the present invention will be described in detail with reference to FIG. 2. The gas field ion source 1 according to the embodiment is configured to include a needle-shaped emitter tip 21, a thin-wire filament 22, two pillar-shaped terminals 26, a cylindrical filament mount 23, and a cylindrical emitter-base mount 64.

Figure 3:
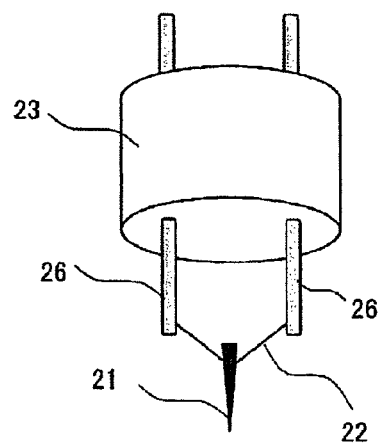
FIGS. 3(A) to 3(C) are diagrams illustrating an example of a peripheral structure of an emitter tip of a gas field ion source of the charged particle microscope according to the present invention.
Figure 3:
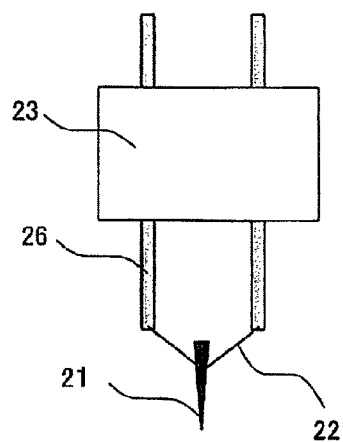
Figure 3:
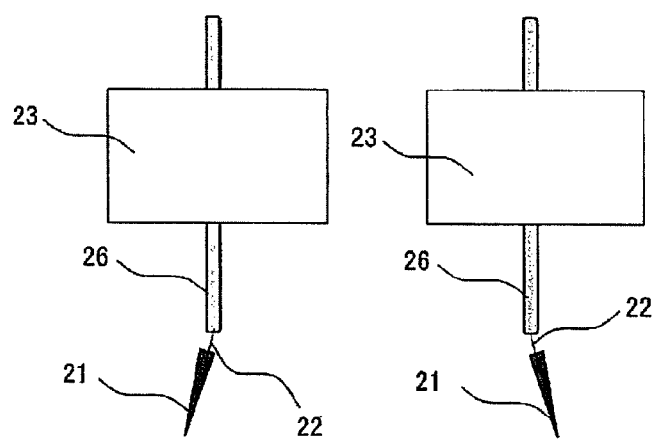

FIG. 3(A) is a pictorial diagram of the cylindrical filament mount 23 as viewed from the emitter tip side. The needle-shaped emitter tip 21 is connected to an approximate center of the thin-wire filament 22. The thin-wire filament 22 is V-shaped in FIG. 3(A) and is connected between the two pillar-shaped terminals 26. FIG. 3(B) is a front diagram, and the angle of the V shape of the filament 22 is an obtuse angle. FIG. 3(C) is a side diagram. As described above, the apparatus according to the embodiment has a structure of allowing the vibration from the floor 20 or the like not to be easily transmitted to the ion source. However, it is found out through the mechanical vibration simulation of this structure that the filament 22 is shaken sideways as illustrated in FIG. 3(C) by the influence of the noise on the ion source. In addition, it is found out the vibration amplitude depends on the angle of the V shape and the vibration amplitude is decreased when the angle is not an acute angle of about 60 degrees of the related art but an obtuse angle as in the present invention. Particularly, when the angle is about 100 degrees or more, the vibration reducing effect is greatly improved in comparison with the related art.

The filament mount 23 is fixed to the emitter-base mount 64 with an insulating material or the like interposed therebetween. By doing so, the emitter tip 21 can be applied with a high voltage. An operating exhaustion hole 67 which the ion beam is to pass through is formed on the ion source vacuum chamber 68.

The field ion source according to the embodiment is configured to further include an extraction electrode 24 and a cylindrical sidewall 28. The extraction electrode 24 is disposed to face the emitter tip 21 and has the opening which the ion beam 14 is to pass through. The extraction electrode can be applied with a high voltage.

A space surrounded by the extraction electrode 24, the sidewall 28, and the filament mount 23 is called a gas molecule ionization chamber 15.

In addition, a gas supply pipe 25 at the distal end of the gas supply mechanism 76 is connected to the gas molecule ionization chamber 15. A to-be-ionized gas (ionized gas) is supplied to the emitter tip 21 through the gas supply pipe 25.

In the embodiment, the to-be-ionized gas (ionized gas) is helium. In addition, the cooling mechanism of the emitter tip 21 is not presented in FIG. 2.

Figure 4:
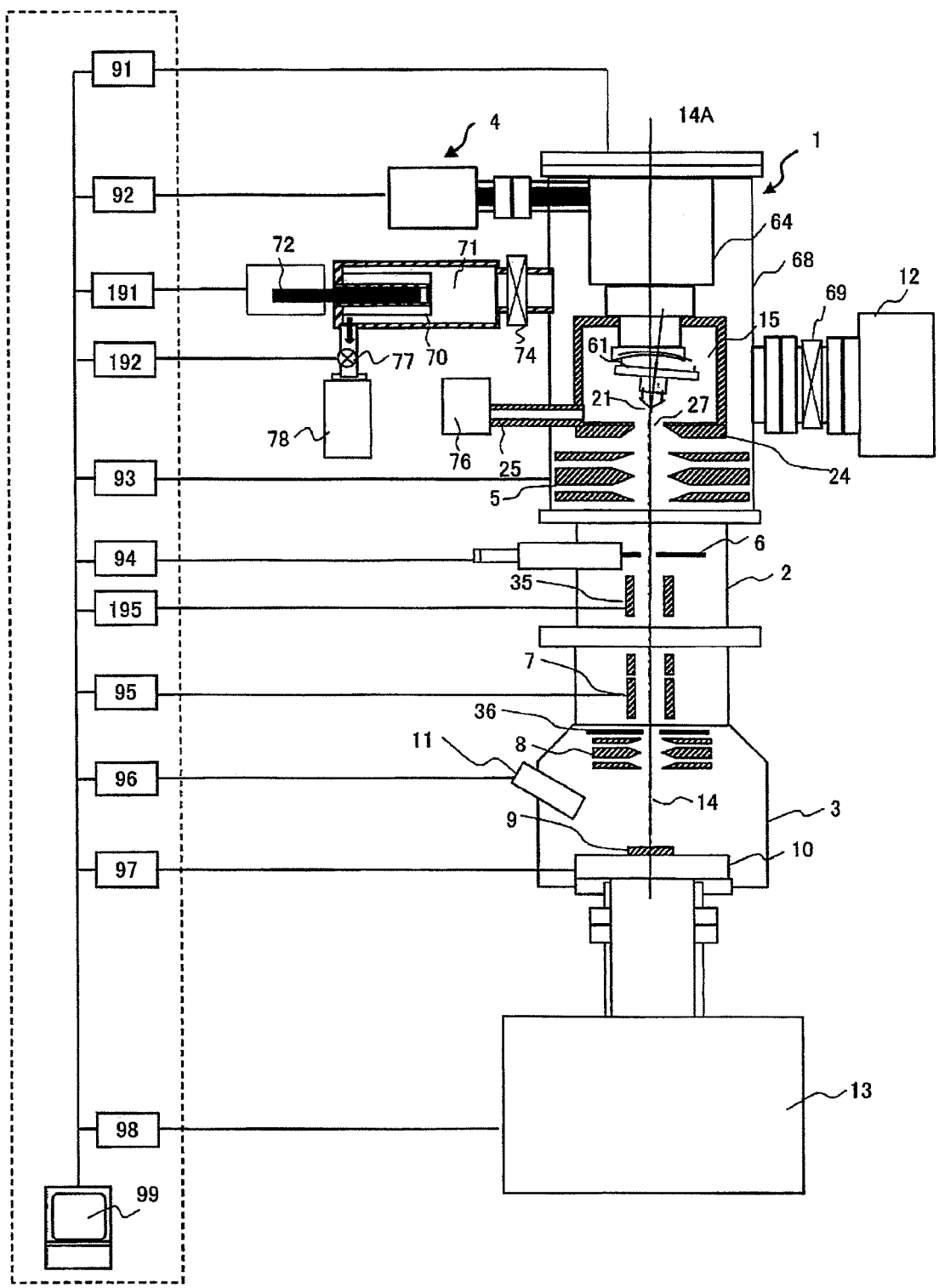
FIG. 4 is a schematic diagram illustrating a configuration of a control system of an example of the charged particle microscope according to the present invention.

FIG. 4 illustrates an example of controllers of the ion microscope according to the present invention illustrated in FIG. 1. The controllers according to the embodiment include a field ion source controller 91 which controls the gas field ion source 1, a refrigerator controller 92 which controls the refrigerator 4, a temperature controller 191 which controls the heating mechanism 72 for the non-evaporable getters 70, the cooling mechanism 4, and the like, a valve controller 192 which controls opening and closing of a plurality of the vacuum cutoff valves 69, 74, and 77 disposed in the vicinity of the gas field ion source, a lens controller 93 which controls the condenser lens 5 and the objective lens 8, a first aperture controller 94 which controls the first aperture 6 which is movable, a first deflector controller 195 which controls the first deflector, a second deflector controller 95 which controls the second deflector, a secondary electron detector controller 96 which controls the secondary particle detector 11, a sample stage controller 97 which controls the sample stage 10, a vacuum exhaust pump controller 98 which controls the sample chamber vacuum exhaust pump 13, and a computing device 99 which includes an arithmetic unit. The computing device 99 is configured to include an image display unit. The image display unit displays images generated from detection signals of the secondary particle detector 11 and information input by an input means.

The sample stage 10 is configured to include a mechanism of straightly moving the sample 9 in the two perpendicular directions within the sample mounting plane, a mechanism of straightly moving the sample 9 in the direction vertical to the sample mounting plane, and a mechanism of rotating the sample 9 within the sample mounting plane. The sample stage 10 further has a tilting function of changing the irradiation angle of the ion beam on the sample 9 by rotating the sample 9 about the tilting axis. The control is performed by the sample stage controller 97 according the instruction from the computing device 99.

Next, the operations of the field ion source according to the embodiment will be described. In the description herein, helium is employed as an ionized gas. When a sufficient time elapses after vacuum exhaustion, the refrigerator 4 is driven. Accordingly, the emitter tip 21, the extraction electrode 24, and the like are cooled down.

Next, the structure of the emitter tip 21 and the manufacturing method thereof will be described. First, a tungsten wire having a diameter of about 100 to 400 µm and an axis orientation <111> is prepared, and the distal end is formed to be sharp. Accordingly, the emitter tip 21 having a distal end of which radius of curvature is several tens of nanometers can be obtained. In another vacuum chamber, iridium is vacuum-deposited on the distal end of the emitter tip 21. Next, the emitter tip 21 is heated at high temperature by electrically conducting the filament 22, so that the iridium atoms are moved to the distal end of the emitter tip 21. Accordingly, a pyramid structure in the order of nanometer is formed by the iridium atoms. This structure is called a nano-pyramid. The nano-pyramid typically has one atom at the distal end, a three- or six-atom layer as an underlying layer thereof, and a ten-or-more-atom layer as an underlying layer thereof.

Herein, the inventors of the present invention have found that the temperature in the emitter tip heating by electrically conducting the filament 22 needs to be controlled with good reproducibility in order to form the nano-pyramid with good reproducibility. In addition to the heating characteristic of the filament 22 as a single body, the dissipation of the heat of the filament needs to be considered. However, in the case of cooling down to a cryogenic temperature as the ion source 1 according to the embodiment, the influence is particularly great. This means that the condition of the heating control of the emitter tip of the electron gun or the ion source in the related art is different from the condition of the heating control of the emitter tip of the ion source according to the embodiment. As described above, the V shape of the filament 22 greatly influences the mechanical vibration characteristic, and similarly, the V shape of the filament 22 influences the heating characteristic of the emitter tip 21.

Although a thin wire of tungsten is used in the embodiment, a thin wire of molybdenum may be used. In addition, although a coat of iridium is used, a coat of platinum, rhenium, osmium, palladium, rhodium, or the like may be used.

In addition, as a method of forming the nano-pyramid at the distal end of the emitter tip 21, field evaporation in vacuum, gas etching, ion beam irradiation, or the like may be used. According to these methods, a nano-pyramid of tungsten atoms or molybdenum atoms can be formed at the distal end of a tungsten wire or a molybdenum wire. For example, in the case of using a <111> tungsten wire, it is characterized in that the distal end is configured with one or three atoms of tungsten. In addition, alternatively, the same nano-pyramid may be formed at the distal end of a thin wire of platinum, iridium, rhenium, osmium, palladium, rhodium, or the like by an etching process in vacuum. The emitter tip having a sharp distal structure in the atomic order is called a nano-tip.

As described above, the characteristic of the emitter tip 21 of the gas field ion source according to the embodiment is based on the nano-pyramid. By adjusting the electric field intensity formed at the distal end of the emitter tip 21, helium ions can be generated in the vicinity of one atom of the distal end of the emitter tip 21. Therefore, the area where the ions are emitted, that is, the ion beam source is a very narrow area, of which the size is nanometer or less. In this manner, by generating the ions from a very limited area, the beam diameter can be limited to 1 nm or less. For this reason, the current value per unit area and unit solid angle of the ion source is increased. This is an important characteristic for obtaining an infinitesimal-diameter and large current ion beam on the sample.

In addition, in the case where one-atom nano-pyramid is formed at the distal end by using platinum, rhenium, osmium, iridium, palladium, rhodium, or the like, similarly current emitted from unit area and unit solid angle, that is, ion source brightness can be increased, so that it is suitable for reducing the beam diameter on the sample of the ion microscope or increasing the current. However, in the case where the emitter tip is sufficiently cooled down and gas is sufficiently supplied, it is not necessary to form the single atom at the distal end, but sufficient performance can be obtained with three, six, seven, ten, or more atoms. Particularly, it has been found that, in the case where the distal end is formed with four or more atoms and less than ten atoms, the ion source brightness can be increased, and the stable operation can be performed so as to allow the atoms at the distal end not to be easily evaporated.

Next, a voltage is applied between the emitter tip 21 and the extraction electrode 24. A strong electric field is formed at the distal end of the emitter tip. The helium supplied from the gas supply pipe 25 is pulled to the emitter tip surface by the strong electric field. The helium reaches the vicinity of the distal end of the emitter tip 21 where the strongest electric field exists. The helium is field-ionized at the site, so that helium ion beam is generated. The helium ion beam is guided to the ion beam irradiation system through a hole 27 of the extraction electrode 24.

Next, operations of the ion beam irradiation system of the ion microscope according to the embodiment will be described. The operations of the ion beam irradiation system are controlled by instructions from the computing device 99. The ion beam 14 generated by the gas field ion source 1 is condensed by the condenser lens 5, the beam diameter of the ion beam is limited by the beam limiting aperture 6, and the ion beam source is condensed by the objective lens 8. The condensed beam is scanned and irradiated on the sample 9 on the sample stage 10. Herein, the large current acquisition condition is used where the magnification of the condensation of the ion beam on the sample by the condenser lens and the objective lens is at least 0.5 or more. By doing so, it is possible to increase the current relative to the beam diameter and to increase a signal-to-noise ratio of a scanned ion image.

The secondary particles emitted from the sample are detected by the secondary particle detector 11. The signal from the secondary particle detector 11 is brightness-modulated by the secondary electron detector controller 96 to be transmitted to the computing device 99. The computing device 99 generates a scanning ion microscope image and displays the image on the image display unit. By doing so, high resolution observation on the sample surface can be implemented.

Figure 5:
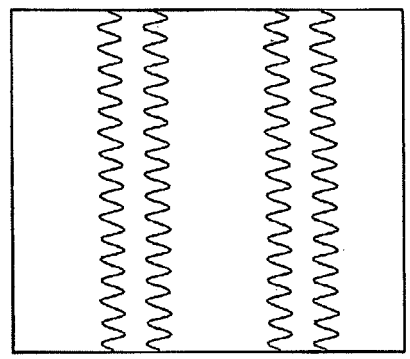
FIGS. 5(A) to 5(C) are schematic diagrams illustrating an example of a scanned ion image obtained by the charged particle microscope according to the present invention.
Figure 5:
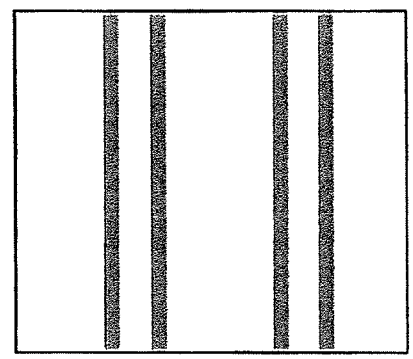
Figure 5:
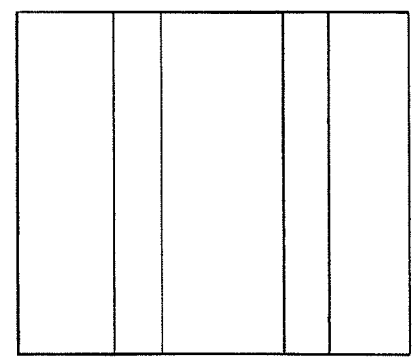

FIGS. 5(A) to 5(C) are schematic diagrams illustrating an ultra-high resolution observation image of a sample surface. The sample has a structure of two straight lines. In FIG. 5(A), it is observed that, when the distal end of the emitter tip mechanically vibrates, edges of the two straight lines are shaken. In FIG. 5(B), it is observed that, when the distal end of the emitter tip mechanically vibrates and the ion beam scanning frequency is low, the edges of the two straight lines are blurry. FIG. 5(C) is a schematic diagram illustrating an ultra-high resolution observation image obtained in the state where the apparatus according to the embodiment normally operates. In this figure, it is observed that the edges of the two straight lines are clear. This is an effect obtained by reduction in vibration amplitude of the distal end of the emitter tip by forming the filament to be in a V shape and setting the angle of the V shape to an obtuse angle. As a result, it is possible to obtain a resolution of about 0.2 nm which is an aberration of the lens in the scanned ion image of the sample surface.

Figure 6:
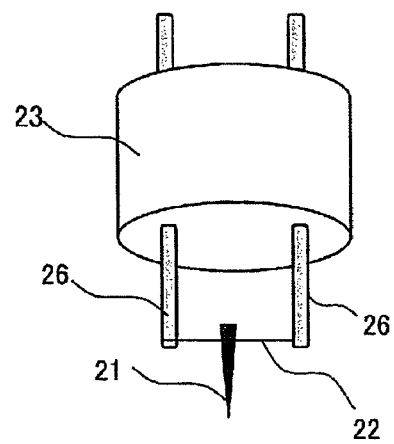
FIGS. 6(A) to 6(D) are diagrams illustrating an example of a peripheral structure of an emitter tip of a gas field ion source of the charged particle microscope according to the present invention.
Figure 6:
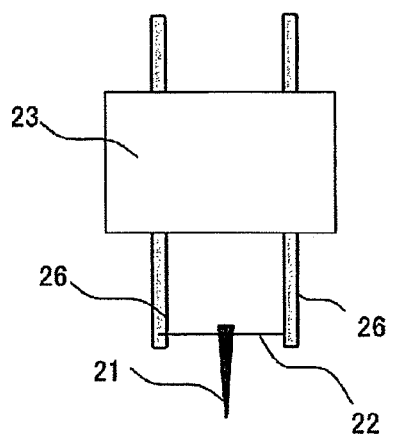
Figure 6:
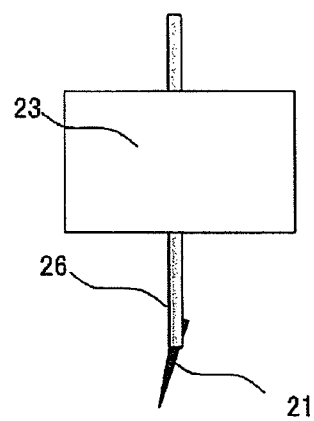
Figure 6:
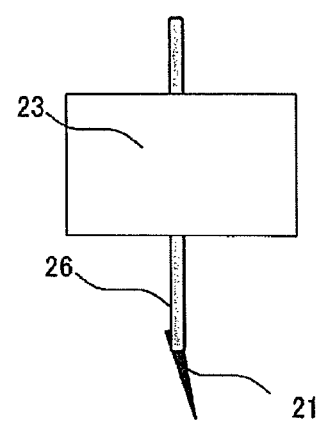

In addition, in FIG. 6(A) illustrating another embodiment, the connection points between the pillar-shaped terminals 26 and the filament 21 are connected by the filament 22 at approximately shortest distance, and the emitter tip 21 is connected to the approximate center of the filament 22.

FIG. 6(A) is a pictorial diagram of the cylindrical filament mount 23 as viewed from the emitter tip 21 side. FIG. 6(B) is a front diagram, in which the filament has a shape of a straight line and the emitter tip 21 is connected to the approximate center thereof. In the embodiment, it is also possible to obtain a resolution of about 0.2 nm which is an aberration of the lens in the scanned ion image of the sample surface. However, in order to stabilize the heating characteristic of the filament, a process of increasing the interval of the filament terminals to increase the length of the filament 22, or adding a stabilizing circuit to the control circuit is needed. In addition, if small deformation of a U shape or a V shape is applied to the approximate center, the localized resistivity of the substantial central portion of the filament 22 is relatively increased, so that it is possible to obtain an effect in that, it is suitable for heating the filament 22 up to high temperature and it is possible to reduce the mechanical vibration amplitude at the distal end of the emitter tip 21. In addition, by using the ion beam apparatus of scanning and irradiating the sample 9 with the ion beam 14 emitted from the gas field ion source 1 and detecting the secondary particles emitted from the sample to obtain the sample observation image, it is possible to obtain an effect of obtaining an ultra-high resolution sample observation image and an effect capable of removing shaking or the like in the sample observation image.

Figure 7:
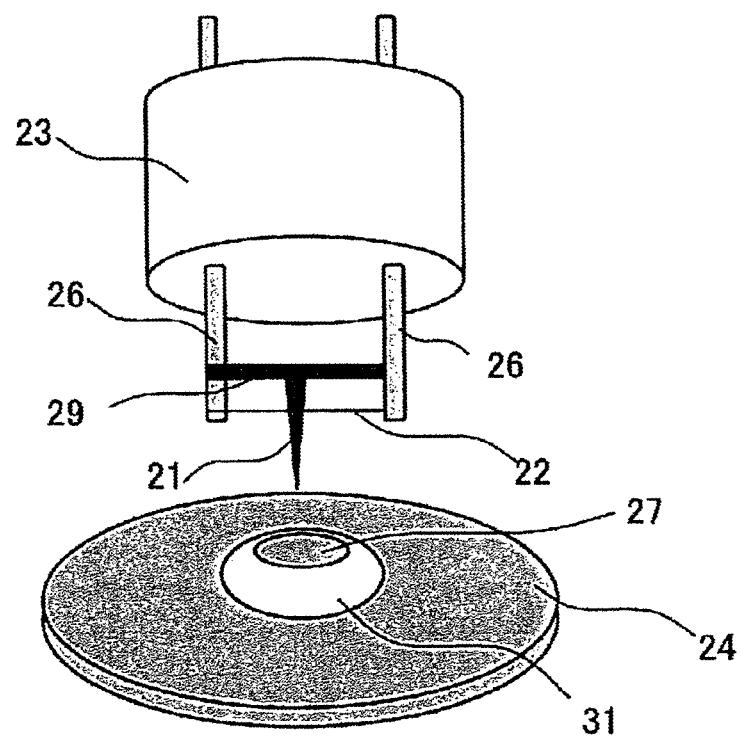
FIG. 7 is a diagram illustrating an example of a peripheral structure of an emitter tip of a gas field ion source of the charged particle microscope according to the present invention.

In addition, as illustrated in a side diagram of FIG. 6(C), it has found that the emitter tip 21 itself is slightly shaken. Therefore, in FIG. 7 illustrating another embodiment, the filament 22 has a shape of a straight line, and besides the filament 22, a second wire material 29 connecting at least two terminals exists, and the base portion of the emitter tip 21 is connected to the filament 22 and the second wire material 29. By doing so, slight vibration of the emitter tip 21 itself is also successfully reduced. As a result, the aberration of the lens is improved, so that it is possible to obtain a resolution of about 0.1 nm.

In addition, as illustrated in FIG. 7, it is characterized in that the substantial central portion of the extraction electrode 24 has a convex structure 31 toward the emitter tip 21. By doing so, the distance between the two terminals and the extraction electrode is increased, discharge or the like does not occur between the two terminals and the extraction electrode, so that it is possible to obtain an effect of increasing in reliability.

In the embodiment described hereinbefore, it is possible to obtain an effect capable of reducing the mechanical vibration amplitude of the distal end of the emitter tip. In addition, by using the ion beam apparatus of scanning and irradiating the sample 9 with the ion beam emitted from the gas field ion source 1 and detecting the secondary particles emitted from the sample to obtain the sample observation image, it is possible to obtain an effect of obtaining an ultra-high resolution sample observation image and an effect capable of reducing shaking, blur, or the like in the sample observation image.

In addition, if an external magnetic field is shield by configuring the field ion source 1, the ion beam irradiation system, and the vacuum chambers such as the sample chamber 3 with magnetic materials, the diameter of the ion beam is decreased, so that it is possible to obtain an effect of implementing higher resolution observation.

In addition, as described in the embodiment, if the emitter tip of the gas field ion source 1 is configured in a nano-pyramid, an ion beam having an infinitesimal beam diameter and large current can be obtained, so that it is possible to obtain an effect of obtaining an ultra-high resolution sample observation image with a high signal-to-noise ratio and it is possible to remove shaking or the like in the sample observation image.

In addition, in the charged particle beam apparatus equipped with the gas field ion source 1, by using the charged particle beam apparatus characterized in that the magnification of the ion beam projected on the sample is at least 0.5 or more, it is possible to obtain an effect in that the ion beam current is particularly increased; and by using the ion beam apparatus of scanning and irradiating the sample 9 with the ion beam emitted from the gas field ion source 1 and detecting the secondary particles emitted from the sample to obtain the sample observation image, it is possible to obtain an effect of obtaining an ultra-high resolution sample observation image with a high signal-to-noise ratio and an effect capable of removing shaking or the like in the sample observation image.

In addition, in the case of the apparatus configured by omitting the tilting mechanism 61 which changes the tilt of the emitter tip, it is possible to reduce the distortion of the ion beam at the condenser lens 5 by adjusting the tilt of the condenser lens 5 according to the direction of the ion beam emitted from the distal end of the emitter tip, and thus, the diameter of the ion beam is decreased, so that it is possible to obtain an effect of implementing higher resolution observation. In addition, since the tilting mechanism of the emitter tip 21 can be omitted, it is possible to obtain an effect capable of simplifying the structure of the ion source and furthermore implementing a low-cost apparatus.

In addition, an ion emission pattern of the emitter tip 21 is observed by another vacuum apparatus, and the tilting direction of the emitter tip 21 is accurately adjusted, and after that, if it is introduced into the apparatus according to the embodiment, it is possible to omit the tilting mechanism 61 which changes the tilt of the emitter tip 21 or to reduce the tilting range. By doing so, it is possible to obtain an effect capable of simplifying the structure of the ion source and furthermore implementing a low-cost apparatus.

In addition, according to the embodiment hereinbefore, in the above-described gas field ion source, the distal end of the emitter tip 21 is formed in a nano-pyramid configured with atoms, so that the ionization area is limited, and thus, the ion source 1 having higher brightness is formed, so that it is possible to perform higher resolution sample observation. In addition, at this time, since the total ion current is decreased, the ionized gas is circulated and reused, so that it is possible to obtain an effect of providing a gas field ion source having a higher use efficiency of the ionized gas.

Although the helium gas is employed in the embodiment, hydrogen, neon, argon, krypton, xenon, or other gases may be employed in the present invention. By doing so, if hydrogen or helium is used, it is possible to obtain an effect in that an infinitesimal surface of the sample can be observed by the ion beam; and if neon, argon, krypton, or xenon is used, it is possible to obtain an effect in that the ion beam becomes suitable for the sample processing with the ion beam, and the mechanical vibration amplitude of the distal end of the emitter tip can be further reduced.

Second Embodiment

Figure 8:
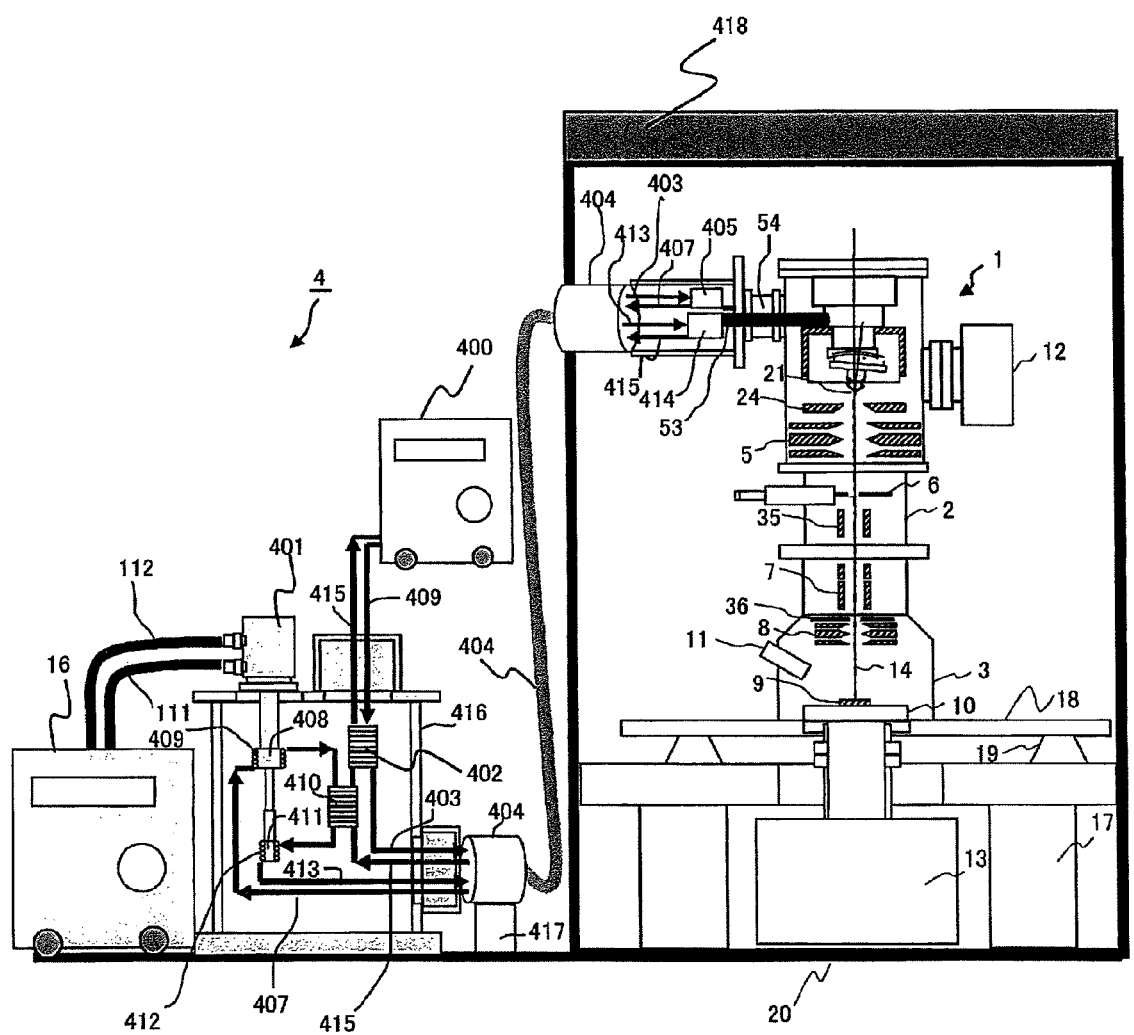
FIG. 8 is a schematic diagram illustrating a configuration of an example of the charged particle microscope according to the present invention.

Next, an example of the charged particle beam apparatus according to the embodiment will be described with reference to FIG. 8. In FIG. 8, the cooling mechanism 4 of the charged particle beam apparatus illustrated in FIG. 1 will be described in detail. In the example, the cooling mechanism 4 employs a helium circulation type.

The cooling mechanism 4 according to the embodiment cools the helium gas as a coolant by using a GM type refrigerator 401 and heat exchangers 402, 405, 409, and 412 and circulates the cooled helium gas by the compressor unit 400. The helium gas compressed at, for example, 0.9 MPa by the compressor and having a room temperature of 300 K is allowed to flow into the heat exchanger 402 through the pipe 409 and exchanges heat with the low-temperature backward helium gas to be described later to be cooled down to a temperature of about 60 K. The cooled helium gas is transported through the pipe 403 in the insulated transfer tube 404 to flow into the heat exchanger 405 disposed in the vicinity of the gas field ion source 1. Herein, by cooling the heat conduction material thermally integrated with the heat exchanger 405 down to a temperature of about 65 K, the above-described shield reducing the thermal radiation is cooled down. The heated helium gas is allowed to flow out the heat exchanger 405 and to flow through the pipe 407 into the heat exchanger 409 thermally integrated with the first cooling stage 408 of the GM type refrigerator 401 to be cooled down to a temperature of about 50 K and to be allowed to flow into the heat exchanger 410. The helium gas exchanges heat with the low-temperature backward helium gas to be described later to be cooled down to a temperature of about 15K, and after that, is allowed to flow into the heat exchanger 412 thermally integrated with the second cooling stage 411 of the GM type refrigerator 401 to be cooled down to a temperature of about 9 K. The cooled helium gas is transported through the pipe 413 in the transfer tube 404 to flow into the heat exchanger 414 disposed in the vicinity of the gas field ion source 1, so that the cooling conduction bar 53 which is a good heat conduction material thermally connected to the heat exchanger 414 is cooled down to a temperature of about 10 K. The helium gas heated by the heat exchanger 414 is allowed to sequentially flow through the pipe 415 into the heat exchangers 410 and 402 and exchanges the above-described helium gas to be heated up to almost a room temperature of about 275 K, and the helium gas is recovered through the pipe 415 to the compressor unit 400. In addition, the above-described low-temperature portion is contained in a vacuum heat-insulating container 416, and the transfer tube 404 is adiabatically connected although not shown. In addition, in the vacuum heat-insulating container 416, although not shown, an irradiation shield plate, a laminated heat-insulating material, or the like prevents heat intrusion due to radiation heat from the room temperature portions into the low temperature portions.

In addition, the transfer tube 404 is firmly fixed to and supported by the floor 20 or a supporting body 417 installed on the floor 20. Herein, although not shown, the pipes 403, 407, 413, and 415 where glass fibers having a low heat conductivity are fixed to and supported by a heat-insulating body made of plastic in the transfer tube 404 are also fixed to and supported by the floor 20. In addition, in the vicinity of the gas field ion source 1, the transfer tube 404 is fixed to and supported by the base plate 18, and similarly, although not shown, the pipes 403, 407, 413, and 415 where glass fibers having a low heat conductivity are fixed to and supported by a heat-insulating body made of plastic in the transfer tube 404 are also fixed to and supported by the base plate 18.

Namely, the cooling mechanism is configured with a cold generating means which generates a cold by expanding a first high pressure gas generated by the compressor unit 16 and a cooling unit which performs cooling by using the cold of the cold generating unit and cools the cooling object by using a helium gas as a second transporting coolant circulating to the compressor unit 400.

The cooling conduction bar 53 is connected to the emitter tip 21 through a deformable copper stranded wire (a wire consisting of a bundle of 100 copper wires each having a diameter of 50 μm) 54 and a sapphire base. By doing so, cooling of the emitter tip 21 is implemented. In the embodiment, although the GM type refrigerator 401 causes the floor to vibrate, the gas field ion source 1, the ion beam irradiation system column 2, the vacuum sample chamber 3, and the like are installed so as to be isolated from the GM type refrigerator 401, it is characterized in that, since the pipes 403, 407, 413, and 415 connected to the heat exchangers 405 and 414 installed in the vicinity of the gas field ion source 1 are firmly fixed to and supported by the floor 20 or the base 18 which does not almost vibrate and are further vibration-isolated from the floor, it is possible to implement a system where the transmission of mechanical vibration is very small.

Figure 9:
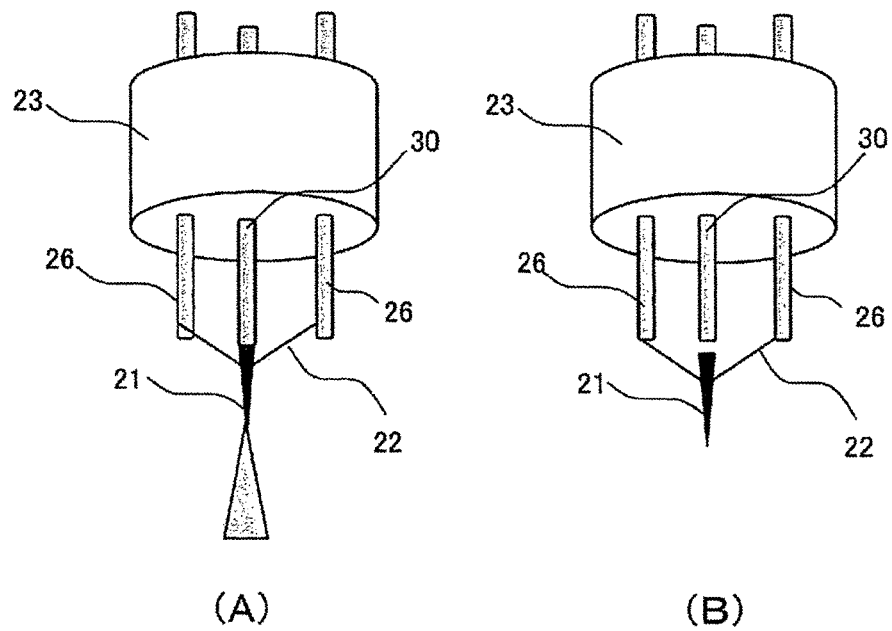
FIGS. 9(A) and 9(B) are diagrams illustrating an example of a peripheral structure of an emitter tip of a gas field ion source of the charged particle microscope according to the present invention.

Next, the structure of the vicinity of the emitter tip according to the embodiment will be described. FIGS. 9(A) and 9(B) are perspective diagrams illustrating the cylindrical filament mount 23 as viewed from the emitter tip side.

In the gas field ion source 1, it is characterized in that, the emitter tip heating mechanism 72 is a mechanism of heating the emitter tip 21 by electrically conducting the filament 22 connecting at least two terminals 26; the emitter tip 21 is connected to the substantial center of the filament 22; in the case where the emitter tip temperature is relatively low, as illustrated in FIG. 9(A), the emitter tip 21 is connected to the terminal excluding the two terminals 26; and in the case where the emitter tip temperature is relatively high, as illustrated in FIG. 9(B), the emitter tip 21 is not connected to the terminals excluding the two terminals.

By doing so, in the case where the emitter tip temperature is relatively low, since the emitter tip is connected to the terminal excluding the two terminals 26, it is possible to obtain an effect capable of reducing the mechanical vibration amplitude of the distal end of the emitter tip. Herein, if the emitter tip temperature is low, it is possible to obtain an effect in that the ion beam current is increased. In addition, in the case where the emitter tip temperature is high, since the emitter tip is not connected to the terminals excluding the two terminals 26, it is possible to obtain an effect where the heat is not dissipated at the time of heating the filament and the heating control accuracy is improved. In addition, by using the ion beam apparatus of scanning and irradiating the sample 9 with the ion beam emitted from the gas field ion source 1 and detecting the secondary particles emitted from the sample 9 to obtain the sample observation image, it is possible to obtain an effect of obtaining a further ultra-high resolution sample observation image and an effect capable of removing shaking or the like in the sample observation image.

In addition, in another embodiment, the gas field ion source 1 is characterized in that the cross section of the filament 22 has a U shape, a V shape, or a hollow tube shape.

In addition, in another embodiment, the gas field ion source 1 is characterized in that the filament 22 is made of manganin.

In addition, in another embodiment, the gas field ion source 1 is characterized in that ceramic coating is performed on the filament 22.

By doing so, since the rigidity of the filament 22 is further increased, the vibration amplitude of the filament becomes small, so that it is possible to obtain an effect of allowing the mechanical vibration amplitude of the distal end of the emitter tip to be small. In addition, by using the ion beam apparatus of scanning and irradiating the sample 9 with the ion beam emitted from the gas field ion source 1 and detecting the secondary particles emitted from the sample 9 to obtain the sample observation image, it is possible to obtain an effect of obtaining a further ultra-high resolution sample observation image and an effect capable of removing shaking or the like in the sample observation image.

Figure 10:
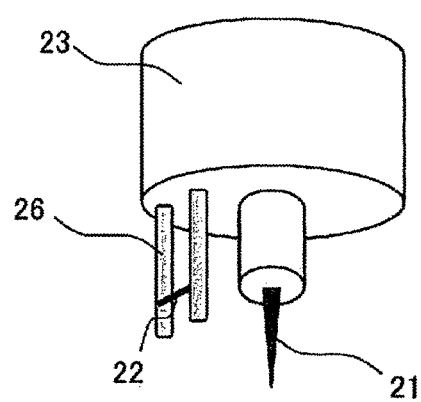
FIG. 10 is a diagram illustrating an example of a peripheral structure of an emitter tip of a gas field ion source of the charged particle microscope according to the present invention.

In addition, in another embodiment, as illustrated in FIG. 10, the structure is used where the emitter tip 21 is directly connected to the filament mount 23 but not connected to the filament 22. The emitter tip heating is implemented by applying a voltage between the emitter tip 21 and the filament 22 to emit electrons from the filament 22 to the emitter tip 21 after the heating of the filament 22. In this structure, the vibration of the filament is not transmitted to the emitter tip.

In this manner, by using the ion beam apparatus of scanning and irradiating the sample 9 with the ion beam further emitted from the gas field ion source and detecting the secondary particles emitted from the sample 9 to obtain the sample observation image, it is possible to obtain an effect of obtaining an ultra-high resolution sample observation image and an effect capable of removing shaking or the like in the sample observation image.

In addition, the ion beam apparatus is characterized in that, in the ion beam apparatus which is equipped with the gas field ion source 1 and scans and irradiates the sample 9 with the ion beam 14 emitted from the gas field ion source 1 and detects the secondary particles emitted from the sample 9 to obtain the sample observation image, when a sound wave having a frequency of 5000 Hz or more is irradiated toward the ion beam apparatus, shaking occurs in the sample observation image. By doing so, since the natural frequency of the installation structure of the emitter tip is 5000 Hz or more, the vibration transmitted from the floor or the like cannot be easily transmitted to the emitter tip.

Figure 11:
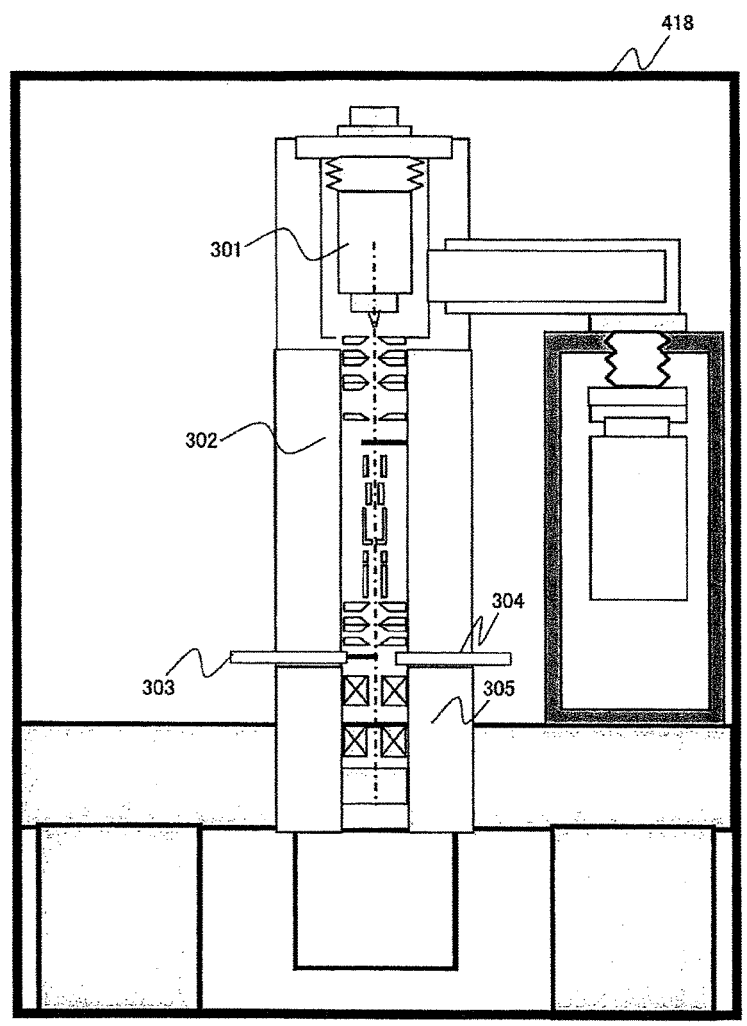
FIG. 11 is a diagram illustrating an example of the charged particle microscope according to the present invention.

In addition, as illustrated in FIG. 11, an effect of a site where a soundproof cover 418 of cutting off sound is provided is further improved.

In this manner, by using the ion beam apparatus of scanning and irradiating the sample with the ion beam further emitted from the gas field ion source and detecting the secondary particles emitted from the sample to obtain the sample observation image, it is possible to obtain an effect of obtaining an ultra-high resolution sample observation image and an effect capable of removing shaking or the like in the sample observation image.

In addition, by using the ion beam apparatus which is characterized in that, in the ion beam apparatus which is equipped with the gas field ion source and scans and irradiates the sample with the ion beam emitted from the gas field ion source and detects the secondary particles emitted from the sample to obtain the sample observation image, image shaking does not occur in the sample observation image with a resolution higher than the maximum resolution of a field ionization emission type scanning electron microscope, it is possible to obtain an effect of obtaining an ultra-high resolution sample observation image and an effect of removing shaking or the like in the sample observation image.

In addition, according to the gas field ion source and the charged particle beam apparatus of the present invention, the vibration from the cooling mechanism is not easily transmitted to the emitter tip and the fixing mechanism of the emitter-base mount is provided, so that the vibration of the emitter tip can be prevented, and high resolution observation can be performed.

Further, the inventors of the present invention have found that the noise of the compressors 16 and 400 illustrated in FIG. 8 causes the gas field ion source 1 to vibrate, so that the resolution is deteriorated. Therefore, in the embodiment, the cover 418 is provided to separate the compressors 16 and 400 and the gas field ion source 1 in spatial. By doing so, it is possible to reduce the influence of the vibration caused by noise of the compressors 16 and 400, so that it is possible to implement high resolution observation.

In addition, although a second helium gas is circulated by using the helium compressor 400 in the embodiment, although not illustrated, flow regulating valves are provided, and the pipes 111 and 112 of the helium compressor 16 and the pipes 409 and 415 are connected to each other through the flow regulating valves; and a portion of the helium gas of the helium compressor 16 in the pipe 409 is supplied as the second helium gas which is a circulating helium gas, and the gas is recovered through the pipe 415 to the helium compressor 16, so that the same effect can be obtained.

In addition, although the GM type refrigerator 401 is used in the embodiment, a pulse tube refrigerator or stirling type refrigerator may be used instead of the GM type refrigerator, and it is not limited to a type of a refrigerator. Although the refrigerator has two cooling stages in the embodiment, the refrigerator may have a single cooling stage, and the number of cooling stages is not particularly limited. For example, by using a helium circulating refrigerator which uses small-sized stirling type refrigeration having one cooling stage and of which the lowest cooling temperature is 50 K, it is possible to implement a compact, and low-cost ion beam apparatus. In this case, instead of the helium gas, a neon gas or hydrogen may be used. In addition, a plurality of the refrigerators may be used.

In addition, it is found out that, in the embodiment, if the helium compressor 400 is stopped at the time of acquiring the scanned ion image, noise of the scanned ion image is reduced, so that it is possible to obtain a clear and high-resolution image. In this case, during the time when the temperature of the ion emitter does not cause a great change in current, the helium is circulated by driving the helium compressor 400, so that the temperature is decreased. According to the method, it is found out that the effect of noise reduction is easily obtained in comparison with stopping the operation of the refrigerator at the time of acquiring the scanned ion image. In addition, it is found out that, if the operations of the helium compressor and the refrigerator are stopped, the noise is further reduced, so that it is possible to obtain a clear and high-resolution image.

Third Embodiment

Next, a charged particle microscope capable of observing a sample surface, performing sample processing, and observing an internal portion of the sample to perform complex analysis of the sample by using a hybrid particle source which has a distal end of an emitter tip formed in a nano-pyramid configured with atoms and extracts an ion beam or electrons from the needle-shaped emitter tip will be described with reference to FIG. 11.

The same configurations as those of the first and second embodiments will be omitted in description.

The charged particle microscope according to the embodiment is configured to include a hybrid particle source 301 which has a distal end of an emitter tip formed in a nano-pyramid configured with atoms and extracts an ion beam or electrons from a needle-shaped emitter tip, a hybrid irradiation system 302 which irradiates a sample with the electron beam and the ion beam, a sample stage 303, a secondary particle detector 304 which detects secondary particles emitted from the sample, an optical system 305 which forms an image from charged particles that have transmitted through the sample, and the like.

Herein, any one of positive and negative high voltage power supplies can be selectively connected to the emitter tip. Namely, in the case of applying the positive high voltage, a positive ion beam can be extracted from the emitter tip; and in the case of applying the negative high voltage, an electron beam can be extracted from the emitter tip. In addition, at least two or more types of gases can be introduced into the hybrid particle source. Namely, at least two types of gases including one of hydrogen and helium and at least one of neon, argon, krypton, xenon, nitrogen, and oxygen can be introduced.

In the charged particle microscope, any one of the ion beams of neon, argon, krypton, xenon, nitrogen, and oxygen can be extracted from the emitter tip, and the sample processing can be performed by irradiating the sample with the ion beam. In addition, the sample surface can be observed by using one of the ion beams of hydrogen and helium extracted from the needle-shaped emitter tip. In addition, the electrons can be extracted from the needle-shaped emitter tip, and the electrons are irradiated on the sample to form an image of the electrons that have transmitted through the sample, so that it is possible to obtain internal information of the sample. By doing so, it is possible to perform complex analysis of the sample without exposure of the sample to the atmosphere.

In the embodiment hereinbefore, in the hybrid charged particle microscope configured to include the hybrid particle source which has a distal end of the emitter tip formed in a nano-pyramid configured with atoms and extracts an ion beam or electrons from the needle-shaped emitter tip, the charged particle irradiating optical system which guides the charged particles from the hybrid particle source to the sample, the secondary particle detector which detects the secondary particles emitted from the sample, the charged particle image forming optical system which forms an image from the charged particles that have transmitted through the sample, and a gas supply pipe which supplies gases to the vicinity of the emitter tip, wherein the gases are selected as two or more types of gases including one of gases of hydrogen and helium and any one of gases of neon, argon, krypton, xenon, nitrogen, and oxygen, and wherein any one of positive and negative high voltage power supplies can be selectively connected to the needle-shaped emitter tip, it is possible to obtain an effect of providing a charged particle microscope capable of observing an infinitesimal surface of the sample by using one of ion beams of hydrogen and helium, capable of performing sample processing by using any one of the ion beams of neon, argon, krypton, xenon, nitrogen, and oxygen, and capable of observing an internal portion of the sample by irradiating the sample with an electron beam and detecting the electrons that have transmitted through the sample. Particularly, since an ion beam having an infinitesimal diameter and an electron beam having an infinitesimal diameter can be obtained by using the nano-pyramid emitter tip, it is possible to obtain an effect of providing a charged particle microscope capable of performing sample information analysis in the order of sub-nanometer.

In addition, in the embodiment hereinbefore, in a hybrid charged particle beam microscope method, wherein a distal end of an emitter tip is in a nano-pyramid configured with atoms, wherein any one of ion beams of neon, argon, krypton, xenon, nitrogen, and oxygen is extracted from the needle-shaped emitter tip and is irradiated on the sample to perform sample processing, wherein one of ion beams of hydrogen and helium is extracted from the needle-shaped emitter tip and is used to observe the sample surface, and wherein electrons are extracted from the needle-shaped emitter tip and are irradiated on the sample to form an image of electrons that have transmitted through the sample to obtain internal information of the sample, it is possible to obtain an effect capable of observing the sample surface, performing sample processing, and observing an internal portion of the sample to perform complex analysis of the sample. Particularly, by using the nano-pyramid emitter tip, it is possible to obtain an effect of providing a charged particle microscope method capable of performing sample information analysis using an ion beam having an infinitesimal diameter and an electron beam having an infinitesimal diameter.

REFERENCE SIGNS LIST 1 gas field ion source
2 ion beam irradiation system column
3 sample chamber
4 cooling mechanism
5 condenser lens
6 movable aperture
7 deflector
8 objective lens
9 sample
10 sample stage
11 secondary particle detector
12 ion source vacuum exhaust pump
13 sample chamber vacuum exhaust pump
14 ion beam
14A optical axis
15 gas molecule ionization chamber
16 compressor
17 equipment stand
18 base plate
19 anti-vibration mechanism
20 floor
21 emitter tip
22 filament
23 filament mount
24 extraction electrode
25 gas supply pipe
26 terminal
27 opening
28 sidewall
29 second wire material
31 convex structure
35 first deflector 36 second aperture
64 emitter-base mount
67 differential exhaust hole
68 vacuum vessel
69 vacuum cutoff valve
70 non-evaporable getter
71 vacuum pump
72 heating mechanism
74 vacuum cutoff valve
76 gas supply mechanism
77 vacuum cutoff valve
78 vacuum pump
91 gas field ion source controller
92 refrigerator controller
93 lens controller
94 first aperture controller
95 ion beam scanning controller
96 secondary electron detector controller
97 sample stage controller
98 vacuum exhaust pump controller
99 computing device
195 first deflector controller
196 temperature controller
418 cover

The invention claimed is:

1. A gas field ion source comprising:
an emitter tip configured to generate ions;
an emitter-base mount configured to support the emitter tip;
a mechanism configured to heat the emitter tip;
an extraction electrode installed to face the emitter tip and configured to include an opening allowing the ions to pass therethrough; and
a mechanism configured to supply a gas to the vicinity of the emitter tip,
wherein the emitter tip heating mechanism is a mechanism of heating the emitter tip by electrically conducting a filament which has a shape of a straight line connecting at least two terminals, connection points between the terminals and the filament is connected by the filament at an approximately shortest distance, and the emitter tip is connected to a substantial center of the filament, and
wherein a second wire material connects the at least two terminals and the second wire material and the filament are connected to a base portion of the emitter tip.

2. The gas field ion source according to claim 1, wherein a substantial central portion of the extraction electrode has a convex structure.

3. The gas field ion source according to claim 1, wherein the filament is made of manganin.

4. The gas field ion source according to claim 1, wherein the filament is subjected to ceramic coating.

5. The gas field ion source according to claim 1, wherein the filament has a structure where localized resistivity of the substantial central portion of the filament is relatively high.

6. A gas field ion source, wherein the gas supplied to the gas field ion source according to claim 1 contains at least one of hydrogen, helium, neon, argon, krypton, and xenon.

7. A gas field ion source, wherein the emitter tip of the gas field ion source according to claim 1 is configured in a shape of a nano-pyramid.

8. The gas field ion source according to claim 7, wherein a distal end of said emitter tip has 4 or more and less than 10 atoms.

9. The gas field ion source of claim 1, further comprising a soundproof cover configured to separate spatially a compressor connected to a refrigeration system for cooling an emitter tip of the gas field ion source.

10. The gas field ion source of claim 1, wherein the natural frequency of an installation structure of the emitter tip is 5000 Hz or more.

11. The gas field ion source according to claim 1, wherein said gas field ion source is configured to provide a magnification of projection of an ion beam on a sample of at least 0.5 or more.

* * * * *